(12) United States Patent
Wi

(10) Patent No.: US 12,253,542 B2
(45) Date of Patent: Mar. 18, 2025

(54) NEEDLE BLOCK FOR EASY ADJUSTMENT OF TIP LENGTH OF NEEDLE UNIT

(71) Applicant: WILLTECHNOLOGY CO., LTD., Gyeonggi-do (KR)

(72) Inventor: Song Yeon Wi, Gyeonggi-do (KR)

(73) Assignee: WILLTECHNOLOGY CO., LTD., Gyeonggi-do (KR)

( * ) Notice: Subject to any disclaimer, the term of this patent is extended or adjusted under 35 U.S.C. 154(b) by 212 days.

(21) Appl. No.: 18/074,690

(22) Filed: Dec. 5, 2022

(65) Prior Publication Data
US 2024/0077518 A1    Mar. 7, 2024

(30) Foreign Application Priority Data
Sep. 1, 2022    (KR) .......................... 10-2022-0110593

(51) Int. Cl.
G01R 1/073    (2006.01)
(52) U.S. Cl.
CPC ..... G01R 1/07314 (2013.01); G01R 1/07364 (2013.01)
(58) Field of Classification Search
CPC .................. G01R 1/07314; G01R 1/07364
USPC ..................................... 324/756.03
See application file for complete search history.

(56) References Cited

U.S. PATENT DOCUMENTS

| | | | | |
|---|---|---|---|---|
| 4,686,467 A * | 8/1987 | DeLapp | ............. | G01R 1/07371 324/537 |
| 5,320,559 A * | 6/1994 | Uratsuji | ............... | H05K 7/1069 324/755.05 |
| 6,242,929 B1 * | 6/2001 | Mizuta | ............... | G01R 1/07357 324/755.06 |
| 6,515,496 B2 * | 2/2003 | Felici | ................. | G01R 1/07357 324/750.25 |
| 10,768,207 B2 * | 9/2020 | Hayashizaki | ...... | G01R 1/07371 |
| 2022/0149555 A1 * | 5/2022 | Cho | .................... | G01R 1/07307 |

FOREIGN PATENT DOCUMENTS

KR    102164358    10/2020

OTHER PUBLICATIONS

Translation of KR 20190078796 (Year: 2019).*

* cited by examiner

Primary Examiner — Christopher P McAndrew
(74) Attorney, Agent, or Firm — IPLA P.A.

(57) ABSTRACT

A needle block for easy adjustment of a tip length of a needle unit, includes: an upper guide plate having a first insertion hole on one side; a lower guide plate separated from the upper guide plate below the upper guide plate and having a second insertion hole at a position corresponding to the first insertion hole; a gap plate interposed between the upper guide plate and the lower guide plate and maintaining the gap between the upper guide plate and the lower guide plate; needle units installed at preset intervals and inserted into the first and second insertion holes with upper and lower end portions supported on one side of the inner surface of the upper guide plate and one side of the inner surface of the lower guide plate, respectively; a gap adjustment member; and a coupling member coupled to one side of the gap plate.

8 Claims, 10 Drawing Sheets

NEEDLE BLOCK FOR EASY ADJUSTMENT OF TIP LENGTH OF NEEDLE UNIT

BACKGROUND

The present invention relates to a needle block for easy adjustment of a tip length of a needle unit, and more particularly, to a needle block for easy adjustment of a tip length of a needle unit in that a tip length of a needle unit can be easily adjusted without disassembling a needle unit, a guide plate, and a gap plate and a working time required for adjusting the length of the needle tip can be greatly reduced, thereby increasing the lifespan of a probe.

Generally, in circuit boards or semiconductors, electrical signals are applied to an object after the manufacturing thereof is completed, and an inspection process is performed to determine whether the object is defective through the signals checked from the applied electrical signals. In this case, a probe card for inspecting a chip constituting a wafer or a PCB inspection device for inspecting a circuit board are mainly used as inspection devices.

The devises include a needle block provided with a plurality of needles that is in contact with the object to be inspected so as to apply the electrical signals thereto. In general, the needles of the needle block are brought into contact with the electrodes of each device of the wafer or circuit patterns or terminals on the circuit boards and a specific current is passed through the needle to measure the electrical characteristics output at that time.

At this time, the needle is physically worn during the polishing process for removing the impurities generated in the process of each device inspection operation of the wafer. When the length of the needle is shortened to a certain level due to the wear, the needle must be replaced. Accordingly, there is a problem in that the maintenance cost of the device is increased due to the replacement of the needle.

Therefore, after the applicant has been developed a probe card that can increase the lifespan of the needle by adjusting the gap between an upper guide plate and a lower guide plate and readjusting the length of the needle tip protruding to the outside, it has applied for a patent and has been registered (Korea Patent No. 10-2164358).

FIG. 1 is a diagram illustrating a needle block according to Korean Patent No. 10-2164358 (hereinafter referred to as 'conventional needle tip length-adjustable needle block').

As shown in FIG. 1, the conventional needle tip length-adjustable needle block includes an upper guide plate (110) having a plurality of first insertion holes (111) formed therein; a lower guide plate (120) disposed under the upper guide plate (110) and having a plurality of second insertion holes (121) formed therein; and a gap plate (130) interposed between the upper guide plate (110) and the lower guide plate (120); a needle unit (140) inserted and installed in the first insertion hole and the second insertion hole; an elastic block (150) disposed between the upper guide plate (110) and the lower guide plate (120); and a pressing means (160) that penetrates through the lower guide plate and the elastic block and is coupled to one side of the gap plate (130) to be movable in the vertical direction.

In the conventional needle tip length-adjustable needle block, when the needle tip is worn, the lower guide plate (120) is raised by the pressing means (160), which is raised by rotating the pressing means (160). At this time, since the elastic block (150) is pressed upward by the ascending lower guide plate (120), the elastic block (150) is compressed. Accordingly, the separation distance between the upper guide plate (110) and the lower guide plate (120) is shortened, so that the tip (T) of the needle unit (140) more protrudes to the outside thereof.

In this way, the conventional needle block capable of adjusting the length of the needle tip has an advantage in that the length of the tip (T) of the needle unit (140) can be easily readjusted and reused only by rotating the pressing means.

However, despite the above advantages, since the elastic block (150) is used to readjust the length of the tip (T) of the needle unit (140), when the needle unit (140) is in contact with the object to be inspected, due to the soft elastic block (150), a movement may occur in the lower guide plate (120) of supporting the needle unit (140) according to the size or detailed design shape of the needle unit (140). Therefore, it is difficult to maintain the flatness between the plurality of the needle unit tips (T) and this may cause problems such as an unstable contact state between the needle unit (140) and the object to be inspected.

Patent Literature 1: Korean Patent Registration No. 10-2164358 (Oct. 5, 2020; Needle unit tip length-adjustable probe card)

SUMMARY OF THE INVENTION

The present disclosure has been made in an effort to solve the problems described above, and an objective of the present invention is to provide a needle block for easy adjustment of a tip length of a needle unit in that the length of a needle tip can be easily adjusted only by sliding a gap adjustment member, thereby greatly increasing the lifespan of a probe and it can prevent the contact defect of the needle unit due to the movement generation thereof in advance by stably maintaining a gap between the upper guide plate and the lower guide plate.

According to one aspect of the present invention so as to accomplish these objects, there is provided to a needle block for easy adjustment of a tip length of a needle unit, including: an upper guide plate having a first insertion hole on one side; a lower guide plate separated from the upper guide plate below the upper guide plate and having a second insertion hole at a position corresponding to the first insertion hole; a gap plate interposed between the upper guide plate and the lower guide plate and maintaining the gap between the upper guide plate and the lower guide plate; a plurality of needle units installed at preset intervals and inserted into the first and second insertion holes with upper and lower end portions supported on one side of the inner surface of the upper guide plate and one side of the inner surface of the lower guide plate, respectively; a gap adjustment member slidably installed in one direction between at least one guide plate of the upper guide plate and the lower guide plate and the gap plate and having a protrusion formed on one side thereof; and a coupling member coupled to one side of the gap plate passing through at least one guide plate of the upper guide plate and the lower guide plate and the gap adjustment member, wherein a groove is formed on one side of at least one guide plate of the upper guide plate and the lower guide plate or one side of the gap plate, whereby the protrusion is inserted into the groove, when the gap adjustment member slides.

In addition, the gap adjustment member includes a body portion that is slidably installed between at least one guide plate of the upper guide plate and the lower guide plate and the gap plate; and a protrusion that protrudes from one side of the body portion and is inserted into the groove, when the body portion slides in one direction.

In addition, the gap adjustment member further comprises a stopper that protrudes from one side of the body portion and is supported on one side of at least one guide plate of the upper guide plate and the lower guide plate at a predetermined position, when the body portion slides in one direction.

In addition, at least one guide plate of the upper guide plate and the lower guide plate in contact with the gap adjustment member includes a first long hole foiled in one side corresponding to the stopper and having a length in a direction corresponding to a moving direction of the gap adjustment member and the stopper is inserted into the first long hole and is supported on one side of an inner surface of the guide plate in which the first long hole is formed at a predetermined position when the body portion is slidably moved.

In addition, the protrusion includes a first protrusion and a second protrusion that protrude at a predetermined interval on one side of the body portion, and the first protrusion is inserted into the groove and the second protrusion is supported on one side of the gap plate, when the body portion is slidably moved.

In addition, the gap adjustment member includes a second long hole formed in a sliding movement direction in a region through which the coupling member passes.

In addition, the needle block further includes a position fixing member slidably installed on one side of at least one guide plate of the upper guide plate and the lower guide plate, wherein an installation position thereof is fixed by the coupling member and it serves to fix a position of the gap adjustment member by supporting one side of the gap adjustment member at one end portion thereof.

In addition, the gap plate includes at least one step formed on an inner side of the groove and the protrusion is inserted into the groove and is selectively inserted into an upper space in which the step or a lower surface of the groove is formed, when the gap adjustment member is slidably moved.

In addition, a plurality of the gap adjustment members is stacked in the vertical direction and an insertion groove for inserting the protrusion of the gap adjustment member located right above therein is formed on one side of an upper surface of the remaining gap adjustment member except for the gap adjustment member, which is located at the uppermost portion thereof.

BRIEF DESCRIPTION OF THE DRAWINGS

The above and other objects, features and advantages of the present invention will be more apparent from the following detailed description taken in conjunction with the accompanying drawings, in which.

| Reference Signs List | |
|---|---|
| 10: upper guide plate | 11: first insertion hole |
| 12: first long hole | 20: lower guide plate |
| 21: second insertion hole | 30: gap plate |
| 31: groove | |
| 40, 40a, 40b, 40c: gap adjustment member | |
| 40ab, 40bb: insertion groove | 41: body portion |
| 41a: second long hole | 42: protrusion |
| 42a, 40aa, 40ba, 40ca: first protrusion | |
| 42b: second protrusion | 50: coupling member |
| 60: needle unit | 70: position fixing member |
| T: tip portion | |

DETAILED DESCRIPTION OF THE PREFERRED EMBODIMENT

Hereafter, a preferred embodiment according to the present disclosure are described in detail with reference to the accompanying drawings.

Figure 1:
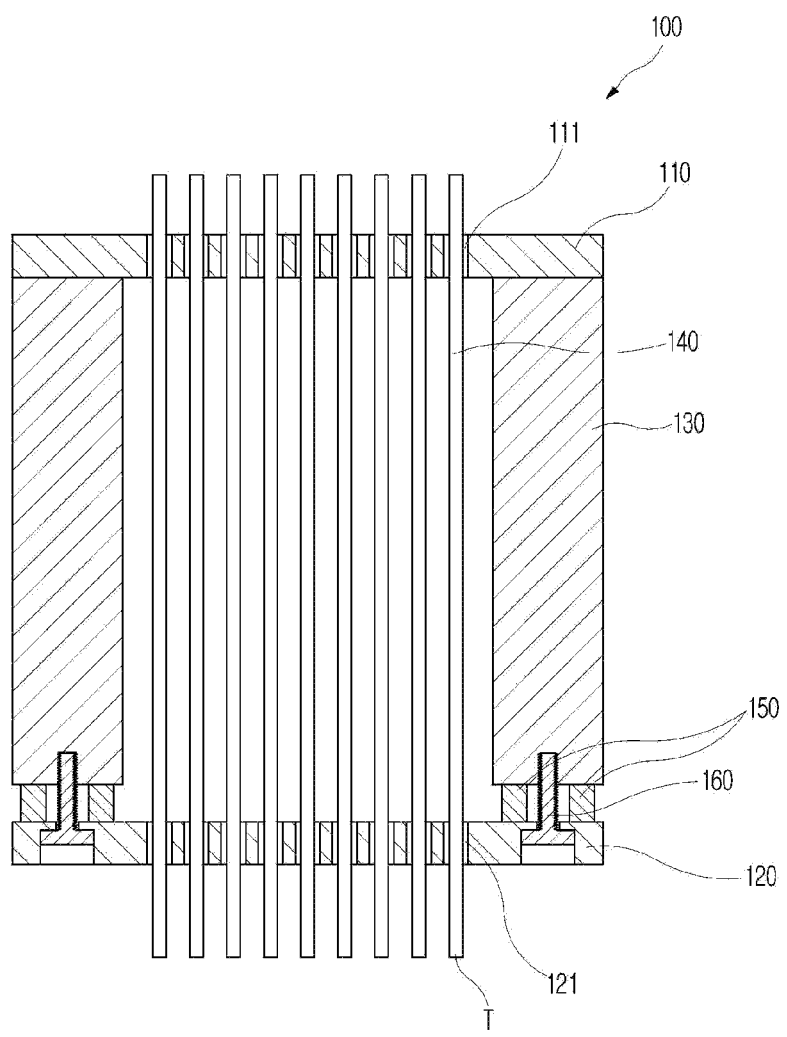
FIG. 1 is a diagram illustrating a conventional needle block for easy adjustment of a length of a needle tip.
Figure 2:
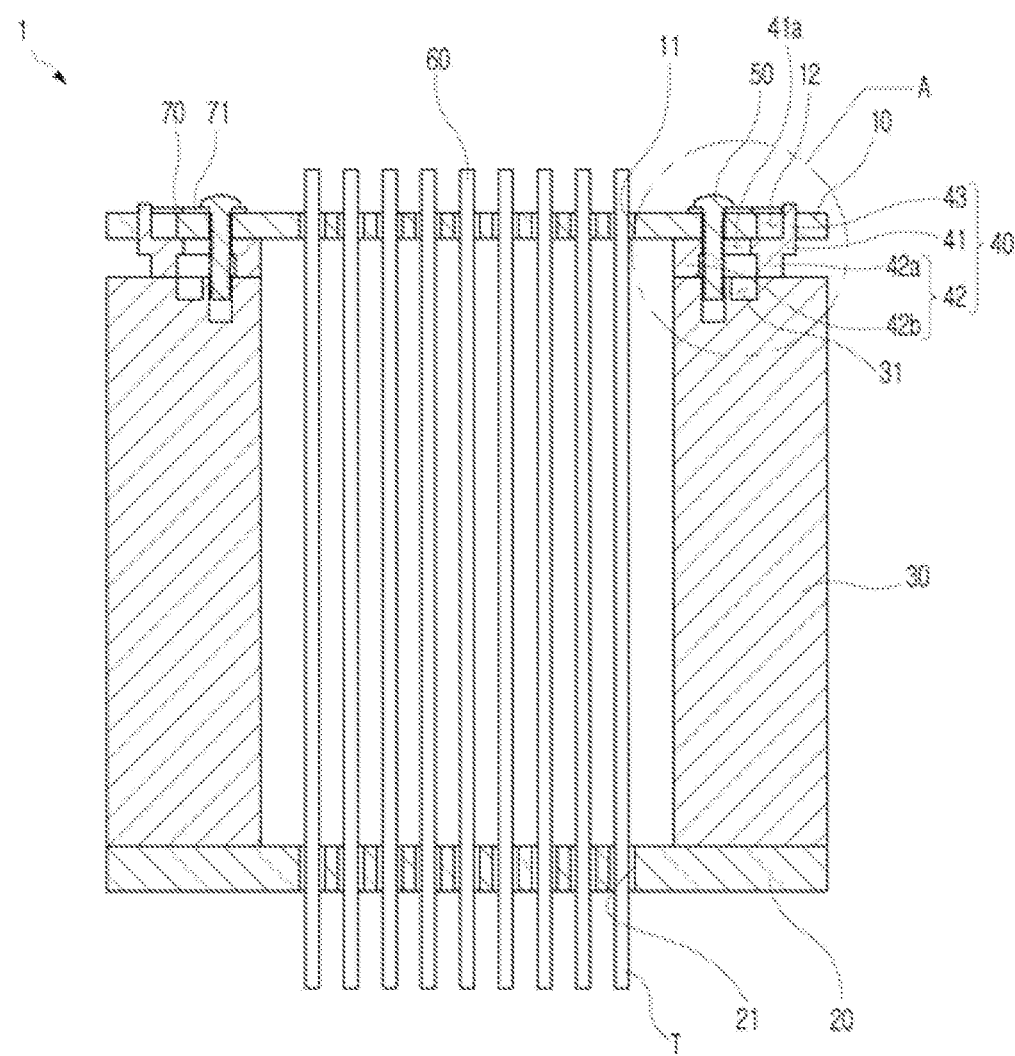
FIG. 2 is a diagram schematically illustrating a needle block for easy adjustment of a tip length of a needle unit according to an embodiment of the present invention.
Figure 3:
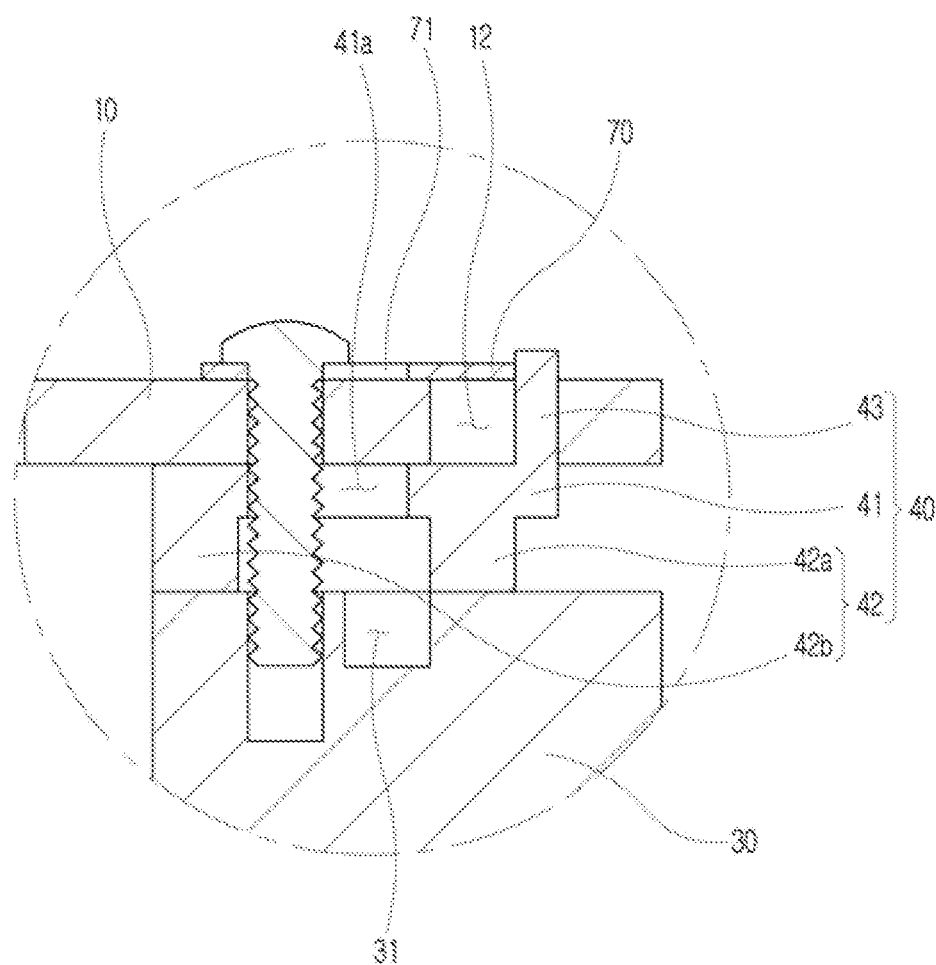
FIG. 3 is an enlarged view of 'A' part shown in FIG. 2.

FIG. 2 is a diagram schematically illustrating a needle block for easy adjustment of a tip length of a needle unit according to an embodiment of the present invention and FIG. 3 is an enlarged view of 'A' part shown in FIG. 2

As shown in FIGS. 2 and 3, the needle block (1) for easy adjustment of the tip length of the needle unit (60) according to an embodiment of the present invention includes an upper guide plate (10), a lower guide plate (20), a gap plate (30), a gap adjustment member (40), a coupling member (50), a needle unit (60), and a position fixing member (70).

The upper guide plate (10) is formed in a plate shape having a predetermined thickness and has a plurality of first insertion holes (11) on one side thereof.

The upper guide plate (10) serves to support the upper end portion of the needle unit (60) to be described later.

The lower guide plate (20) is formed in a plate shape having a predetermined thickness like the upper guide plate (10) and has a plurality of second insertion holes (21) at a position corresponding to the first insertion holes (11).

The lower guide plate (20) serves to support the lower end portion of the needle unit (60) to be described later by being spaced apart from the upper guide plate (10) downward at a predetermined interval.

The gap plate (30) is formed in a substantially block shape and is interposed on one side corresponding to the outer periphery of the region between the upper guide plate (10) and the lower guide plate (20).

The gap plate (30) serves to maintain the interval of the upper guide plate (10) and the lower guide plate (20).

The gap adjustment member (40) includes a body portion (41) that is slidably installed in inner and outer directions of the needle block in the region between the upper guide plate (10) and the gap plate (30), a protrusion (42) protruding downward from one side of a lower surface of the body portion (41), and a stopper (43) protruding upward from an upper surface of one end portion of the body portion (41).

Here, the protrusion (42) may include a first protrusion (42a) and a second protrusion (42b) protruding downward at a predetermined interval on one side of a lower surface of the body portion (41). In addition, a groove (31) having a shape corresponding to the first protrusion (42a) is formed on one side of an upper surface of the gap plate (30).

When the gap adjustment member (40) slides in inner and outer directions of the needle block, the first protrusion (42a) is inserted into the groove (31) formed on one side of the gap plate (30).

Accordingly, it controls the interval of the upper guide plate (10) and the lower guide plate (20) and serves to adjust the length of the tip portion (T) by allowing the needle tip to be exposed to the outside according to the adjusted interval.

In addition, when the first protrusion (42a) is inserted into the groove (31), the second protrusion (42b) is supported on the side portion of the gap plate (30). Accordingly, the gap adjustment member (40) is stably seated on the upper portion of the gap plate (30) to prevent the upper guide plate (10) from moving in the vertical or left and right directions by the gap adjustment member (40).

Therefore, the arrangement of the plurality of needles coupled to the upper guide plate (10) can be stably maintained.

On the other hand, in this embodiment, the gap adjustment member (40) slides inward of the needle block (1), so that the first protrusion (42a) is inserted into the groove (31) and the second protrusion (42b) is supported on the side portion of the gap plate (30). However, this is only one embodiment and the present invention is not necessarily limited thereto. That is, it can be supported on the side of the gap plate (30) by sliding to the outside of the needle block (1) according to the adjustment of the shapes of the gap adjustment member (40) and the groove (31) and the position of the coupling member (50).

In addition, the upper guide plate (10) includes a first long hole (12) formed in an area corresponding to the stopper.

Accordingly, when the gap adjustment member (40) slides in the inner and outer directions of the needle block (1), the stopper (43) is supported on the inner surface of the upper guide plate (10) at a predetermined position, so that it is possible to prevent the separation of the gap adjustment member (40) from its installation position in advance.

The coupling member (50) may use a coupling means such as a bolt and is coupled to one side of the gap plate (30) by passing through the upper guide plate (10) and the gap adjustment member (40), so that it serves to firmly maintain the gap between the upper guide plate (10) and the lower guide plate (20).

On the other hand, in this embodiment, a second long hole (41a) is formed on one side of the gap adjustment member (40) through which the coupling member (50) passes. Accordingly, when it is necessary to adjust the length of the needle tip, it is preferable to be configured to slide the gap adjustment member (40) in a state in which the coupling member (50) is slightly loosened.

The plurality of the needle units (60) is formed in a substantially rod shape and is sequentially inserted into the first insertion hole (11) and the second insertion hole (21), so that the upper end portion thereof is supported on one side of the inner surface of the upper guide plate (10), in which the first insertion hole (11) is formed and the lower end portion thereof is supported on one inner side of the inner surface of the lower guide plate (20), in which the second insertion hole (21) is foiled, to be vertically arranged These needle unit (60) serves to receive a signal from the electrode when the lower end thereof, that is, the tip portion (T), contacts the electrode of the object to be inspected, and then transmit it to an external tester through a space transformer connected to the upper portion thereof.

The position fixing member (70) is formed in a substantially plate shape and is slidably disposed on the upper surface of the upper guide plate (10).

In addition, the position fixing member (70) includes a through hole (71), through which the coupling member (50) passes, formed at one side thereof. The through hole (71) is formed in the shape of a long hole so as to be slidably movable.

The position fixing member (70) serves to fix the position of the gap adjustment member (40) by supporting the gap adjustment member (40) at one side thereof and an operation description for this will be described in more detail below with reference to FIG. 4 and FIG. 5.

Figure 4:
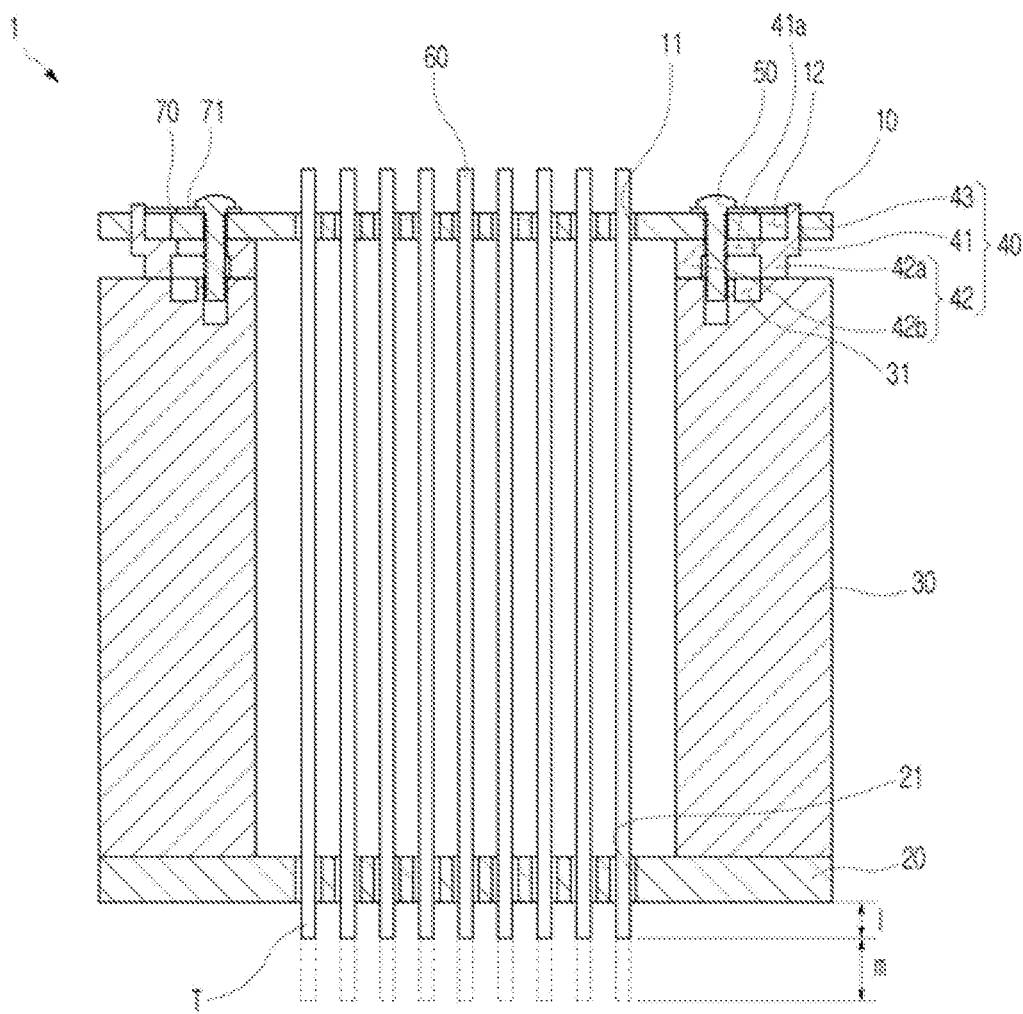
FIG. 4 is a diagram illustrating a worn state of a tip of a needle unit according to an embodiment of the present invention.
Figure 5:
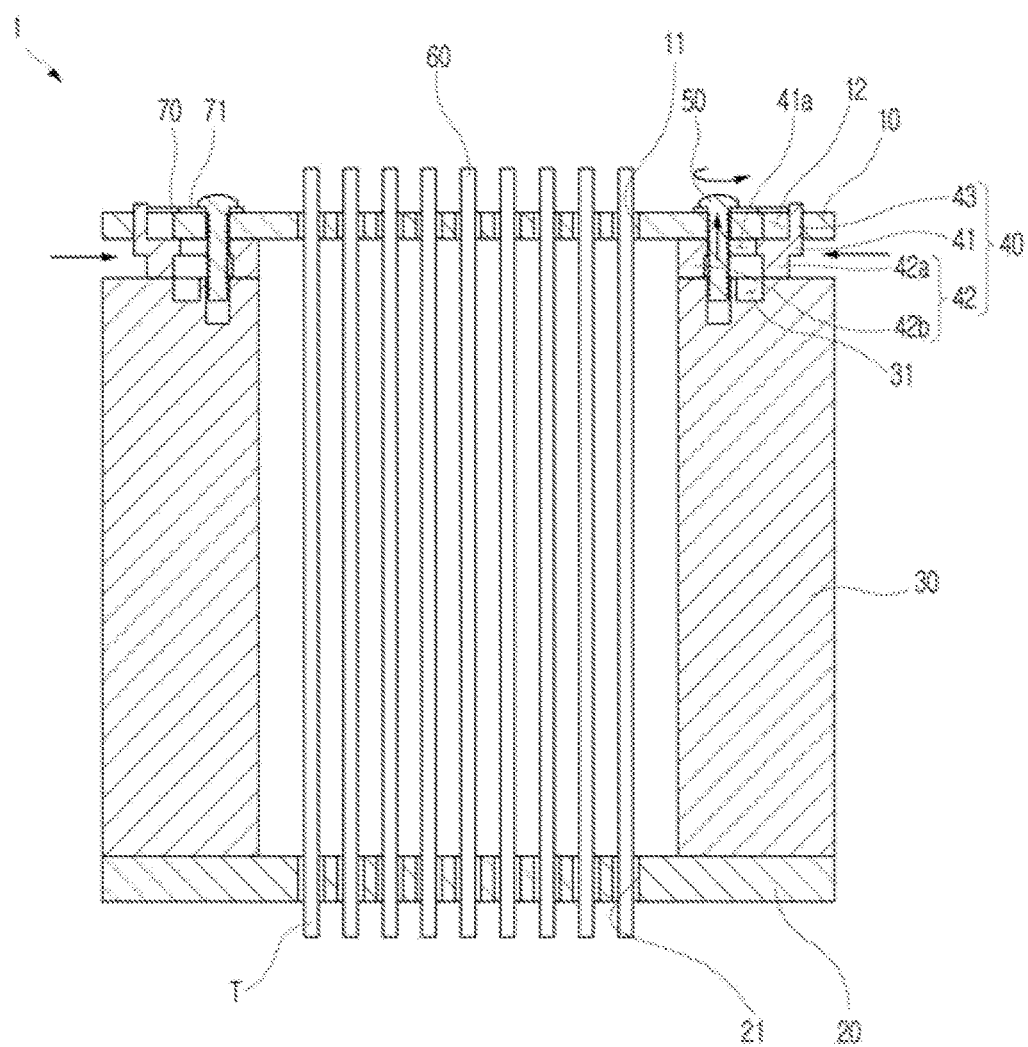
FIG. 5 is a diagram illustrating a state in which a gap adjustment member according to an embodiment of the present invention slides in the inner direction of the needle block.
Figure 6:
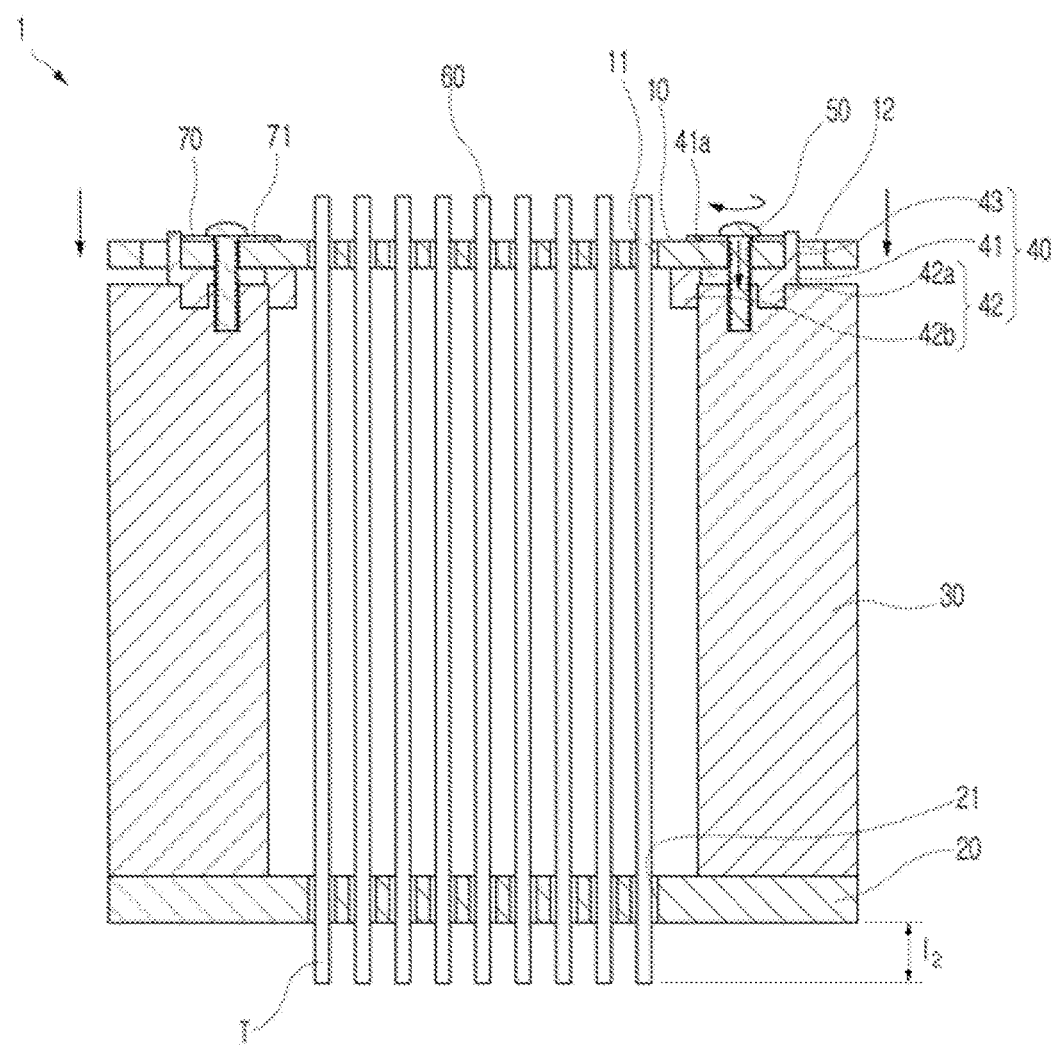
FIG. 6 is a diagram illustrating a state in which a length of a needle tip is adjusted while a first protrusion is inserted into the groove according to an embodiment of the present invention.

FIG. 4 is a diagram illustrating a worn state of a tip of a needle unit according to an embodiment of the present invention, FIG. is a diagram illustrating a state in which a gap adjustment member according to an embodiment of the present invention slides in the inner direction of the needle block, and FIG. 6 is a diagram illustrating a state in which a length of a needle tip is adjusted while a first protrusion is inserted into the groove according to an embodiment of the present invention.

An operation of the needle block (1) for easy adjustment of the tip length of the needle unit (60) according to an embodiment of the present invention having such a configuration will be described with reference to the accompanying FIG. 4 to FIG. 6 as follows.

According to the inspection process of the inspection object, the tip portions (T) of the needle units (60) repeatedly contact the electrode of the inspection object.

At this time, the position fixing member (70) is interposed between the upper guide plate (10) and the coupling member (50) to be fixedly installed by the coupling member (50) and one end portion thereof supports one side of the stopper (43).

Accordingly, one side of the stopper (43) is supported on the inner surface of the upper guide plate (10) and the other side is supported by the position fixing member (70) so that its position can be firmly maintained.

When the inspection process is repeatedly performed as described above, the tip portion (T) of the needle unit (60) is gradually worn by friction between the needle unit (60) and the electrode.

At this time, when it is determined that the inspection operation is difficult due to the wear of the tip portion (T) of the needle unit (60) by the length of "m" shown in FIG. 4, the length readjustment operation of the tip portion (T) of the needle unit (60) is performed.

First, the operator rotates the coupling means (50) to loosen the gap adjustment member (40) to the extent that it can slide. Thereafter, as shown in FIG. 5, the position fixing member (70) and the gap adjustment member (40) are simultaneously pushed and slid in the inner direction of the needle block.

As the gap adjustment member (40) moves, the first protrusion (42a) is inserted into the groove (31) and the second protrusion (42b) is supported on one side of the side surface of the gap plate (30).

Accordingly, the upper guide plate (10) descends as much as the height of the first protrusion (42a) and the distance between the upper guide plate (10) and the lower guide plate

(20) decreases according to the descending distance of the upper guide plate (10), so that the length of the tip portion (T) is adjusted.

As described above, the needle block (1) for easy adjustment of the tip length of the needle unit (60) according to this embodiment only slides and moves the gap adjustment member (40) without disassembling various parts, so that the length of the tip portion (T) can be readjusted. Accordingly, it has a feature that can greatly shorten the working time without requiring a separate skill level.

Figure 7:
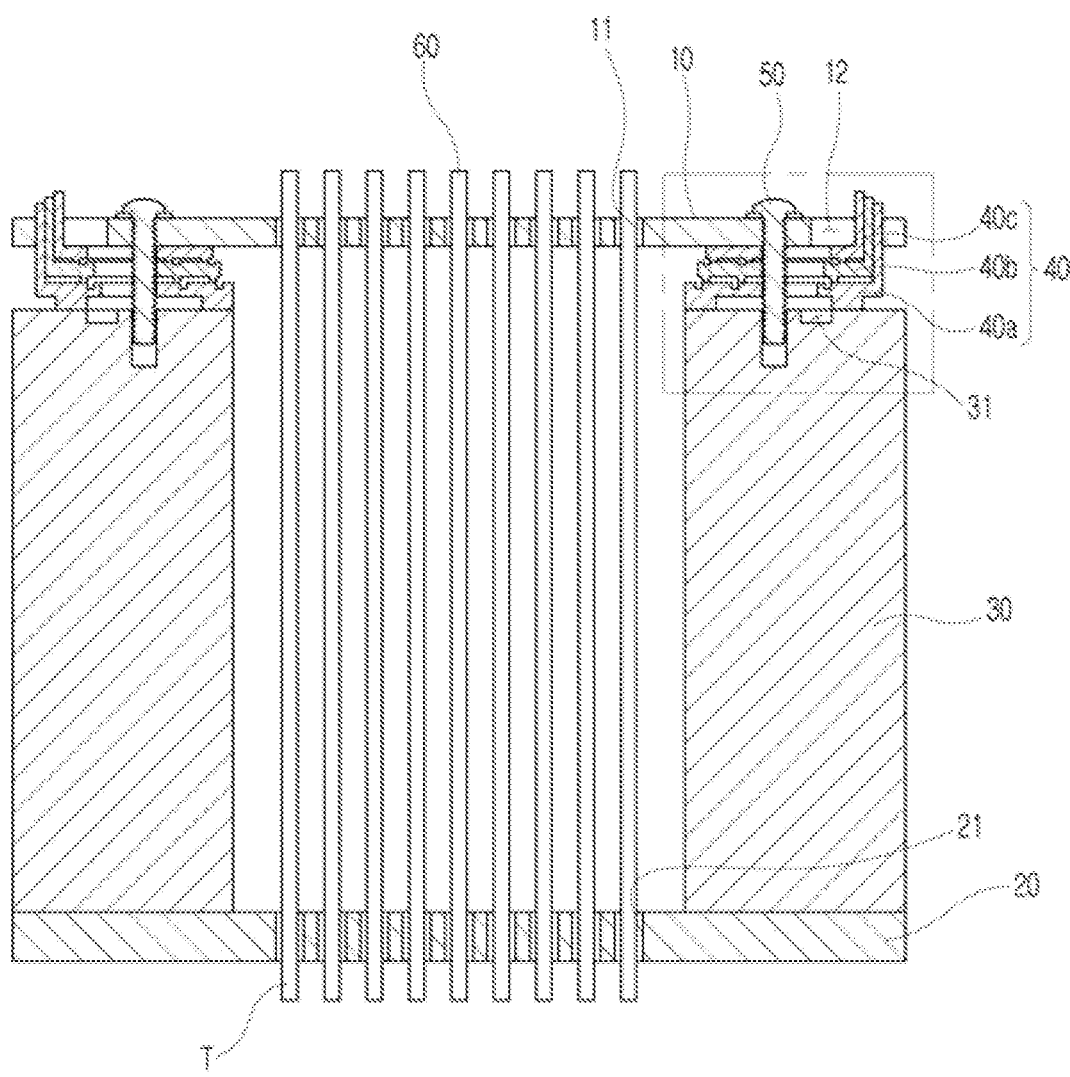
FIG. 7 is a diagram illustrating a needle block for easy adjustment of a tip length of a needle unit according to another embodiment of the present invention.
Figure 8A:
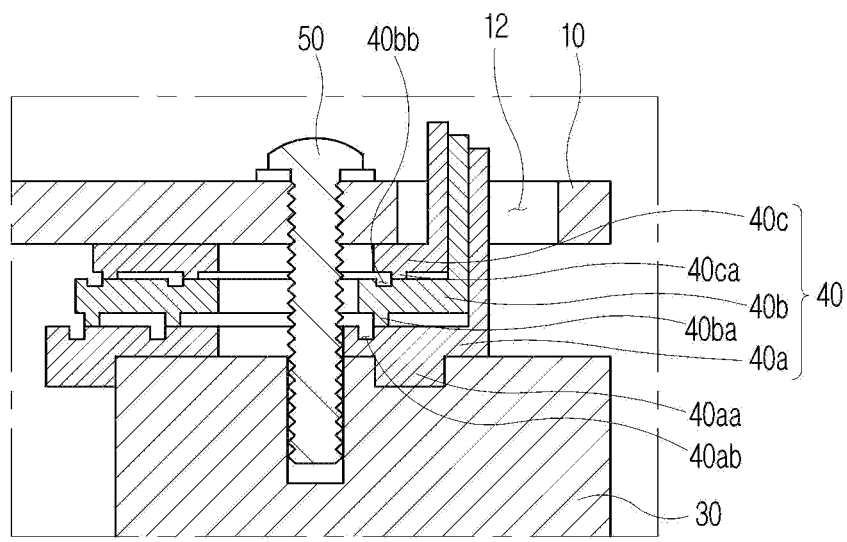
FIGS. 8A to 8C are diagrams each illustrating a state of adjusting a length of a tip portion according to another embodiment of the present invention.
Figure 8B:
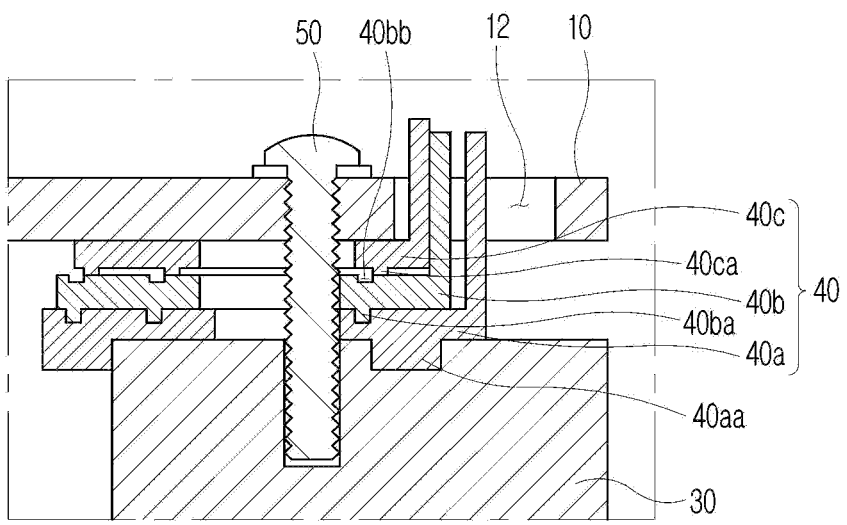
Figure 8C:
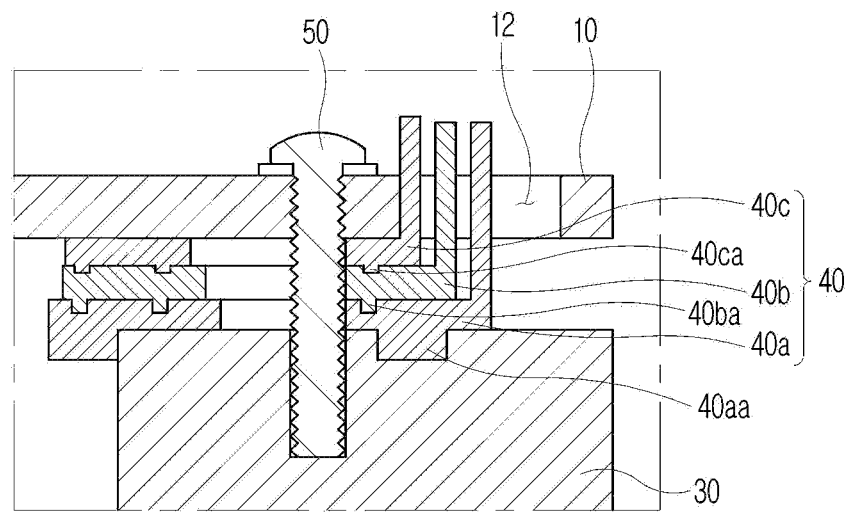

FIG. 7 is a diagram illustrating a needle block for easy adjustment of a tip length of a needle unit according to another embodiment of the present invention and FIGS. 8A-8C are diagrams each illustrating a state of adjusting a length of a tip portion according to another embodiment of the present invention.

The basic configuration of the embodiment of FIG. 7 and FIGS. 8A to 8C are the same as that of the embodiment of FIG. 2 to FIG. 6, but is formed in a structure in which the length of the tip portion (T) of the needle unit (60) can be adjusted in multiple steps.

As shown in FIG. 7, in this embodiment, unlike the previous embodiment, three gap adjustment members (40a, 40b, and 40c) are stacked in the vertical direction. In addition, as shown in FIG. 8A. insertion grooves (40ab and 40bb) are respectively formed on an upper surface of the gap adjustment member (40a) located at the lowermost portion thereof and the gap adjustment member (40b) located at an upper portion of the gap adjustment member (40a).

In this embodiment configured in this way, as shown in FIGS. 8A to 8C, when the operator wants to adjust the length of the tip portion (T) for the first time, by sliding the three gap adjustment members (40a, 40b, and 40c) and the position fixing member (70) in the inner direction of the needle block (1), the first protrusion (40aa) of the lowermost gap adjustment member (40a) located at the lowermost portion thereof is inserted into the groove (31) of the gap plate (30) to first adjust the length of the tip portion (T).

Thereafter, when the tip portion (T) of the needle unit (60) is worn again, by sliding the gap adjustment member (40b) located on the lowermost gap adjustment member (40a) in the inner direction of the needle block (1), the first protrusion (40ba) of the gap adjustment member (40b) is inserted into the insertion groove (40ab) of the lowermost gap adjustment member (40a) to secondarily adjust the length of the tip portion (T).

Next, when the operator wants to readjust the length of the tip portion (T) again, the length of the tip portion (T) can be thirdly adjusted by sliding the gap adjustment member (40c) located at the top portion thereof in the same manner as above.

As described above, this embodiment has a great feature in that the length of the tip portion (T) can be repeatedly readjusted according to the number of the gap adjustment members.

Since other structures are the same as those of the above-described basic embodiment, additional descriptions are omitted here.

Figure 9:
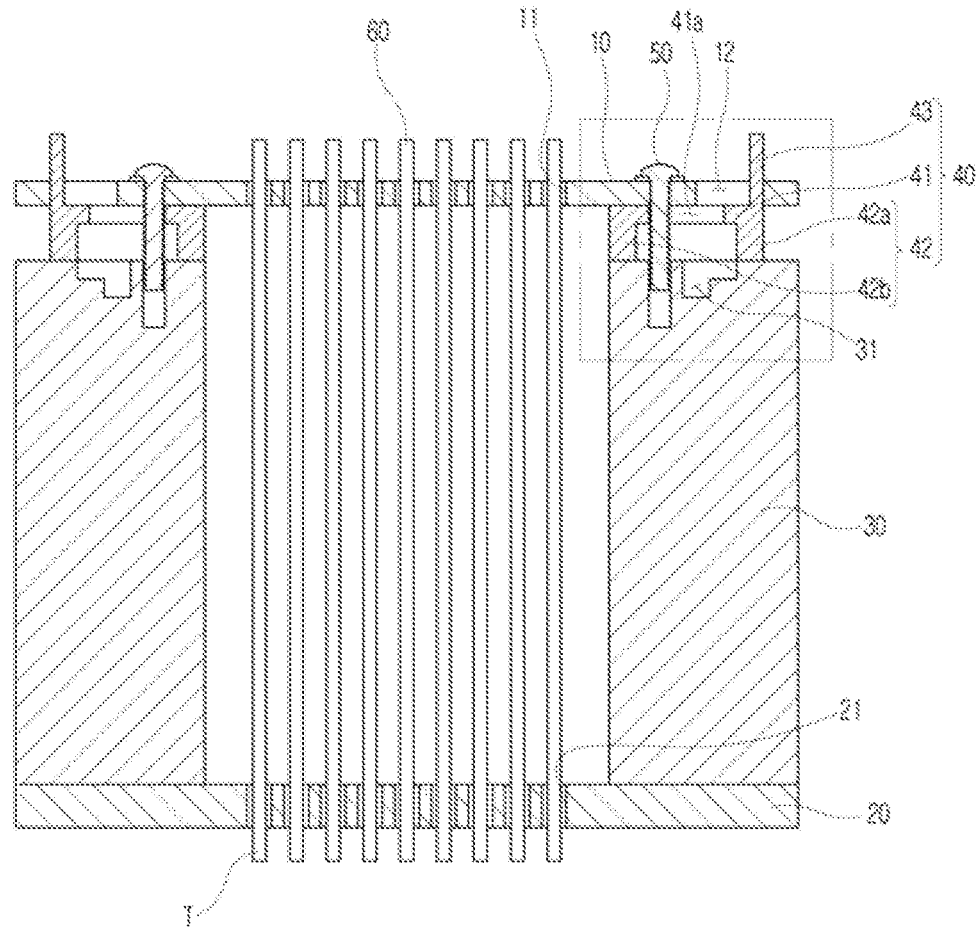
FIG. 9 is a diagram illustrating a needle block for easy adjustment of a tip length of a needle unit according to further another embodiment of the present invention.
Figure 10A:
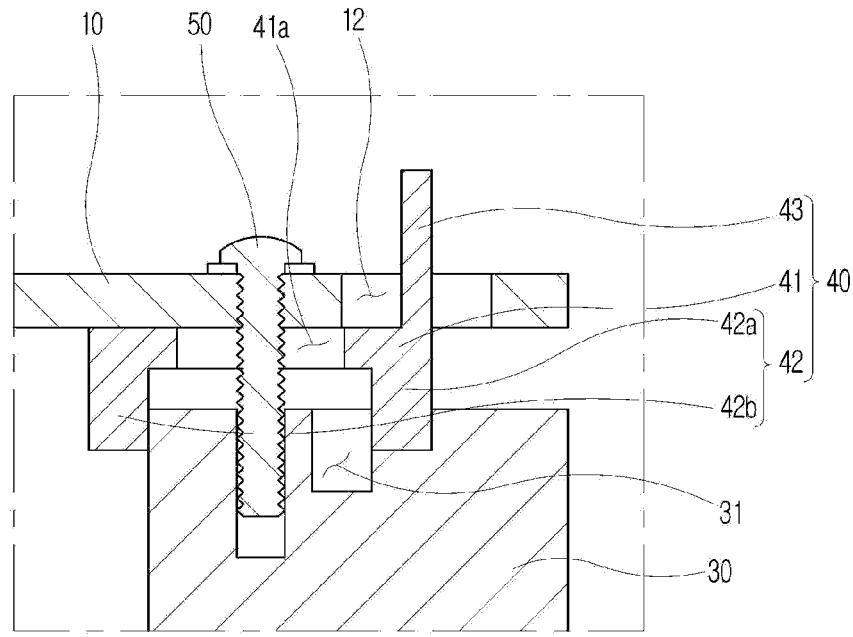
FIGS. 10A and 10B are diagrams each illustrating a state of adjusting a length of a tip portion according to further another embodiment of the present invention.
Figure 10B:
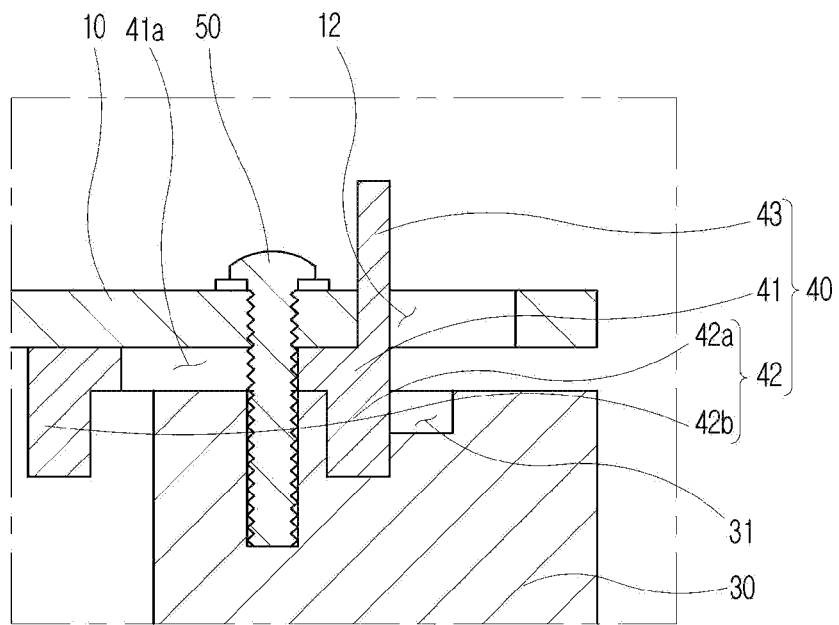

FIG. 9 is a diagram illustrating a needle block for easy adjustment of a tip length of a needle unit according to further another embodiment of the present invention and FIGS. 10A and 10B are diagrams each illustrating a state of adjusting a length of a tip portion according to further another embodiment of the present invention.

This embodiment is another structure in which the length of the tip portion (T) can be adjusted in multiple stages.

As shown in FIG. 9, the groove (31), which is foiled in the gap plate (30) are formed in a multi-stage step shape and the first protrusion (42a) of the gap adjustment member (40) is formed to have a length corresponding to the deepest depth in the groove (31).

In this embodiment, if the operator wants to readjust the length of the tip portion (T) of the needle unit (60), as shown in FIG. 10A, by sliding the gap adjustment member (40) in the inner direction of the needle block (1) and allowing the first protrusion (42a) to be supported on one step formed at the top of the plurality of steps formed in the groove (31), the length of the tip portion (T) is readjusted by the height of the corresponding step.

Thereafter, as the inspection process is continuously performed, when the tip portion (T) of the needle unit (60) is worn again, as shown in FIG. 10B, the gap adjustment member (40) is further moved in the inner direction of the needle block (1), so that the first protrusion (42a) is supported on a second step formed directly below the top step (first step) among the plurality of steps formed in the groove (31). Accordingly, the length of the tip portion (T) is readjusted by the difference between the first step and the second step.

As described above, this embodiment is characterized in that the length of the tip portion (T) can be repeatedly readjusted while being formed in a simpler structure.

Since other structures are the same as in the above-described basic embodiment, the remaining descriptions are omitted here.

According to the present invention as described above, there are effects in that the length of the needle tip can be easily adjusted only by sliding the gap adjustment member in order that the protrusion is inserted into the groove, thereby greatly increasing the lifespan of the probe and it can prevent the contact defect of the needle unit due to the movement generation thereof in advance by stably maintaining the gap between the upper guide plate and the lower guide plate.

While the present invention has been described with respect to the specific embodiments, it will be apparent to those skilled in the art that various changes and modifications may be made without departing from the spirit and scope of the invention as defined in the following claims.

What is claimed is:

1. A needle block for easy adjustment of a tip length of a needle unit, comprising:
    an upper guide plate having a first insertion hole on one side thereof;
    a lower guide plate separated from the upper guide plate below the upper guide plate and having a second insertion hole at a position corresponding to the first insertion hole;
    a gap plate that is interposed between the upper guide plate and the lower guide plate and maintains a gap between the upper guide plate and the lower guide plate;
    a plurality of needle units installed at preset intervals and inserted into the first and second insertion holes with upper and lower end portions supported on one side of the inner surface of the upper guide plate and one side of the inner surface of the lower guide plate, respectively;
    a gap adjustment member slidably installed in one direction between at least one guide plate of the upper guide plate and the lower guide plate and the gap plate and having a protrusion formed on one side thereof; and a coupling member coupled to one side of the gap plate passing through at least one guide plate of the upper guide plate and the lower guide plate and the gap adjustment member, wherein a groove is formed on one side of at least one guide plate of the upper guide plate and the lower guide plate or one side of the gap plate, whereby the protrusion is inserted into the groove, when the gap adjustment member slides, and wherein the gap adjustment member comprises:

a body portion that is slidably installed between at least one guide plate of the upper guide plate and the lower guide plate and the gap plate; and the protrusion that protrudes from one side of the body portion and is inserted into the groove, when the body portion slides in one direction.

2. The needle block according to claim 1, wherein the gap adjustment member further comprises a stopper that protrudes from one side of the body portion and is supported on one side of at least one guide plate of the upper guide plate and the lower guide plate at a predetermined position, when the body portion slides in one direction.

3. The needle block according to claim 2, wherein at least one guide plate of the upper guide plate and the lower guide plate in contact with the gap adjustment member includes a first long hole formed in one side corresponding to the stopper and having a length in a direction corresponding to a moving direction of the gap adjustment member, and wherein the stopper is inserted into the first long hole and is supported on one side of an inner surface of the guide plate in which the first long hole is formed at a predetermined position when the body portion is slidably moved.

4. The needle block according to claim 1, wherein the protrusion includes a first protrusion and a second protrusion that protrude at a predetermined interval on one side of the body portion, and the first protrusion is inserted into the groove and the second protrusion is supported on one side of the gap plate, when the body portion is slidably moved.

5. The needle block according to claim 1, wherein the gap adjustment member includes a second long hole formed in a sliding movement direction in a region through which the coupling member passes.

6. The needle block according to claim 1, further comprising:

a position fixing member slidably installed on one side of at least one guide plate of the upper guide plate and the lower guide plate, wherein an installation position thereof is fixed by the coupling member and it serves to fix a position of the gap adjustment member by supporting one side of the gap adjustment member at one end portion thereof.

7. The needle block according to claim 1, wherein the gap plate includes at least one step formed on an inner side of the groove; and wherein the protrusion is inserted into the groove and is selectively inserted into an upper space in which the step or a lower surface of the groove is formed, when the gap adjustment member is slidably moved.

8. The needle block according to claim 1, wherein a plurality of the gap adjustment members is stacked in the vertical direction and an insertion groove for inserting the protrusion of the gap adjustment member located right above therein is formed on one side of an upper surface of the remaining gap adjustment member except for the gap adjustment member, which is located at the uppermost portion thereof.

* * * * *